US008350586B2

(12) United States Patent
Cho et al.

(10) Patent No.: US 8,350,586 B2
(45) Date of Patent: Jan. 8, 2013

(54) METHOD AND APPARATUS OF DEEMBEDDING

(75) Inventors: Shu-Ying Cho, Hsin Chu (TW);
Jiun-Kai Huang, Hsin Chu (TW);
Wen-Sheh Huang, Hsin Chu (TW);
Sally Liu, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 483 days.

(21) Appl. No.: 12/496,946

(22) Filed: Jul. 2, 2009

(65) Prior Publication Data

US 2011/0001504 A1    Jan. 6, 2011

(51) Int. Cl.
 *G01R 31/02* (2006.01)
 *G06F 11/22* (2006.01)
 *H01L 23/58* (2006.01)
(52) U.S. Cl. .............. 324/762.01; 716/136; 257/48
(58) Field of Classification Search .......... 324/750.3, 324/762.01–762.06; 716/50, 136, 138; 257/48, 257/620
 See application file for complete search history.

(56) References Cited

U.S. PATENT DOCUMENTS

| | | | |
|---|---|---|---|
| 7,210,086 B2 * | 4/2007 | Hong | 714/741 |
| 7,215,133 B2 * | 5/2007 | Kwark | 324/762.03 |
| 7,365,529 B2 * | 4/2008 | Yoshida et al. | 324/750.03 |
| 7,552,416 B2 * | 6/2009 | Granik et al. | 716/50 |
| 7,626,411 B2 * | 12/2009 | Shimizume et al. | 324/762.06 |
| 7,712,070 B2 * | 5/2010 | Moon | 716/50 |
| 7,954,080 B2 * | 5/2011 | Yen et al. | 716/136 |
| 7,987,434 B2 * | 7/2011 | Granik et al. | 716/50 |
| 8,250,496 B2 * | 8/2012 | Moon | 716/54 |
| 2008/0237586 A1 * | 10/2008 | Sun et al. | 257/48 |
| 2008/0265378 A1 * | 10/2008 | Lee et al. | 257/620 |

FOREIGN PATENT DOCUMENTS

CN         101091244         12/2007

OTHER PUBLICATIONS

Cho et al., "A Novel Transmission Line De-Embedding Technique for RF Device Characterization," Dec. 2009, pp. 3160-3167, IEEE Transactions on Electron Devices, vol. 56, No. 12.
Cho, H., et al., "A Three-Step Method for the De-Embedding of High-Frequency S-Parameter Measurements," IEEE Trans. Electron Devices, vol. 38, No. 6, pp. 137-1375, Jun. 1991.
Kolding, T.E., "A Four-Step Method for De-Embedding Gigahertz On-Wafer CMOS Measurements," IEEE Trans. Electron Devices, vol. 47, No. 4, pp. 734-740, Apr. 2000.

(Continued)

*Primary Examiner* — Huy Q Phan
*Assistant Examiner* — Joshua Benitez Rosario
(74) *Attorney, Agent, or Firm* — Haynes and Boone, LLP

(57) ABSTRACT

Provided is a method of de-embedding. The method includes forming a test structure having a device-under-test embedded therein, the test structure having left and right pads coupling the device-under-test, the device-under-test dividing the test structure into left and right half structures, the left and right half structures each having intrinsic transmission parameters; forming a plurality of dummy test structures, each dummy test structure including a left pad and a right pad; measuring transmission parameters of the test structure and the dummy test structures; and deriving intrinsic transmission parameters of the device-under-test using the intrinsic transmission parameters of the left and right half structures and the transmission parameters of the test structure and the dummy test structures.

20 Claims, 5 Drawing Sheets

OTHER PUBLICATIONS

Vandamme, E. P., et al., "Improved Three-Step De-Embedding Method to Accurately Account for the Influence of Pad Parasitics in Silicon On-Wafer RF Test-Structures," IEEE Trans. Electron Devices, vol. 48, No. 4, pp. 737-742, Apr. 2001.

Andrei, C., et al., "Efficient De-embedding Technique for 110-GHz Deep-Channel-MOSFET Characterization," IEEE Microwave and Wireless Comp. Lett., vol. 17, No. 4, pp. 301-303, Apr. 2007.

Issaoun, A., et al., "On the Deembedding Issue of CMOS Multigigahertz Measurements," IEEE Trans. Electron Devices, vol. 55, No. 8, pp. 2195-2201, Aug. 2008.

Cha, J., et al., "Uncertainty Analysis of Two-Step and Three-Step Methods for Deembedding On-Wafer RF Transistor Measurements, " IEEE Trans. Electron Devices, vol. 55, No. 8, pp. 2195-2201, Aug. 2008.

Liang, Q., et al., "A Simple Four-Port parasitic Deembedding Methodology for High-Frequency Scattering Parameter and Noise Characterization of SiGe HBTs," IEEE Trans. Microwave Theory and Techniques, vol. 51, No. 11, pp. 2165-2174, Nov. 2003.

Tiemeijer, L. F., et al., "Comparison of the Pad-Open-Short and Open-Short-Load Deembedding Techniques for Accurate On-Wafer RF Characterization of High-Quality Passives," IEEE Trans. Microwave Theory and Techniques, vol. 53, No. 2, pp. 723-729, Feb. 2005.

Wei, X., et al., "A General 4-Port Solution for 110 GHz On-Wafer Transistor Measurements with or without Impedance Standard Substrate (ISS) Calibration," IEEE Trans. Electron Devices, vol. 54, No. 10, pp. 2706-2714, Oct. 2007.

Song, J., et al., "A De-Embedding Technique for Interconnects," in Proc. Elect. Performance Electron. Package, Cambridge, MA, pp. 1371-1375, Oct. 2001.

Cho, M., et al, "A Fully-Scalable De-Embedding Method for On-Wafer S-Parameter Characterization of MOS RF/Microwave Devices," Radio Freq. Int. Circuits (RFIC) Symposium, IEEE, pp. 303-306, Jun. 2005.

Cho, M., et al., "A Novel Cascade-Based De-Embedding Method for On-Wafer Microwave Characterization and Automatic Measurement," Microwave Symposium Digest, IEEE MTT-S Int'l, vol. 2, pp. 1237-1240, Jun. 2004.

Cho, M., et al, "A Shield-Based Three-Port De-Embedding Method for Microwave On-Wafer Characterization of Deep-Submicrometer Silicon MOSFETs," IEEE Trans. Microwave Theory and Techniques, vol. 53, No. 9, pp. 2926-2934, Sep. 2005.

Mangan, A. M., et al, "De-Embedding Transmission Line Measurements for Accurate Modeling of IC Designs," IEEE Trans. Electron Devices, vol. 53, No. 2, pp. 235-241, Feb. 2006.

Reid, J., et al., "Micromachined Rectangular-Coaxial Transmission Lines," IEEE Trans. Microwave Theory and Techniques, vol. 54, No. 8, pp. 3433-3441, Aug. 2006.

Marsh, E., et al., "Gold-Plated Micromachined Millimeter-Wave Resonators Based on Rectangular Coaxial Transmission Lines," IEEE Trans. Microwave Theory and Techniques, vol. 55, No. 1, pp. 78-84, Jan. 2007.

Sun, Y., et al., "Experimental Analysis of Above-IC Inductor Performance with Different Patterned Ground Shield Configurations and Dummy Metals," Microwave Conf., 37th European, IEEE pp. 40-43, Sep. 2006.

Lutz, R. D., et al., "Enhanced Transmission Characteristics of On-Chip Interconnects with Orthogonal Gridded Shield," IEEE Trans. Adv. Packaging, vol. 24, No. 3, pp. 288-293, Aug. 2001.

Wang, X., et al., "Parameter Characterization of Silicon-Based Patterned Shield and Patterned Ground Shield coplanar Waveguides," Millimeter Waves, Global Symposium on 21-24, pp. 142-145, Apr. 2008.

Cheung, T., et al., "Shielded Passive Devices for Silicon-Based Monolithic Microwave and Millimeter-Wave Integrated Circuits," IEEE J. Solid-State Circuits, vol. 41, No. 5, pp. 1183-1200, May 2006.

Lai, I., et al., "High-Q Slow-Wave Transmission Line for Chip Area Reduction on Advanced CMOS Processes," Microelectronic Test Structures, IEEE Int'l Conf., vol. 54, No. 7, pp. 192-195, Mar. 2007.

Zhu, L. "Guided-Wave Characteristics of Periodic Coplanar Waveguides with Inductive Loading—Unit-Length Transmission Parameters," IEEE Trans. Microwave Theory and Techniques, vol. 51, No. 10, pp. 2133-2138, Oct. 2003.

Cheung, T., et al., "On-Chip Interconnect for MM-Wave Applications Using an All-Copper Technology and Wavelength Reduction," ISSC Dig. Tech. Papers, vol. 46, No. 6, pp. 396-397, Feb. 2003.

Komijani, A., et al., "A 24-GHz, +14.5-dBm Fully Integrated Power Amplifier in 0.18-/spl mu/m CMOS," IEEE J. Solid-State Circuits, vol. 40, No. 9, pp. 1091-1098, Sep. 2005.

Lai, I., et al., "60-GHz CMOS Down-Conversion Mixer with Slow-Wave Matching Transmission Lines," IEEE Asian Solid-State Circuits Conf., pp. 195-198, Nov. 2006.

Kim, W., et al., "Characterization of Co-Planar Silicon Transmission Lines with and without Slow-Wave Effect," IEEE Trans. Adv. Packaging, vol. 30, No. 3, pp. 526-532, Aug. 2007.

Cho, M., et al., "Slow-Wave Characteristics of Interconnects on Silicon Substrates," Semiconductor Device Research Symposium, 2003 Int'l, pp. 188-189, Dec. 2003.

Wang, G., et al., "Novel Low-Cost On-Chip CPW Slow-Wave Structure for Compact RF Components and mm-Wave Applications," Elect. Components and Tech. Conf., 58th, 27-30, pp. 186-190, May 2008.

Lin, D. B. "Signal Integrity of Bent Differential Transmission Lines," Electronics Letters, vol. 40, No. 19, pp. 1191-1192, Sep. 16, 2004.

Ghosh, T.K., et al., "Optimization of Coaxial Couplers," IEEE Trans. Electron Devices, vol. 54, No. 7, Jul. 2007, pp. 1753-1759.

U.S. Appl. No. 13/368,877 entitled "A Multiple-Grid Exposure Method", filed Feb. 8, 2012, 31 pages.

U.S. Appl. No. 13/409,653 entitled "Non-Directional Dithering Methods", filed Mar. 1, 2012, 19 pages.

* cited by examiner

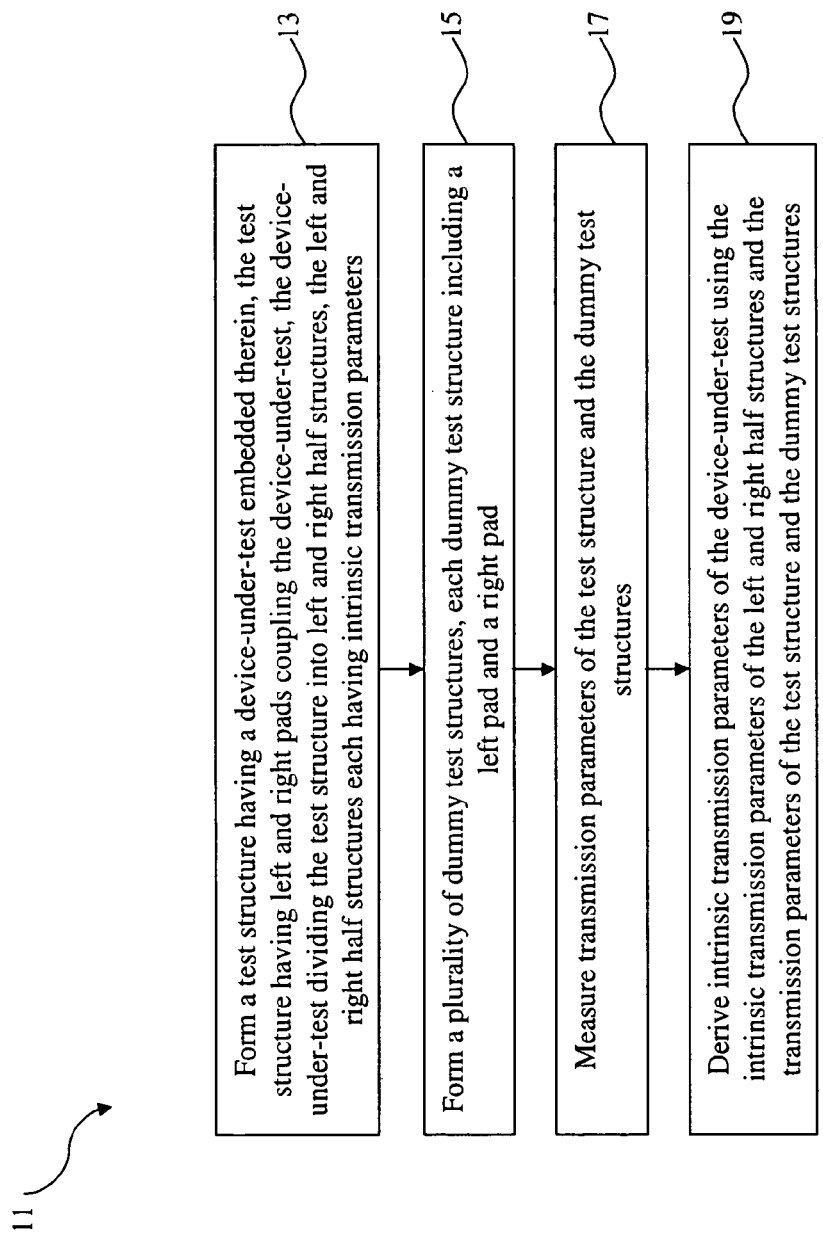

Diagrammatic Top Level View

Diagrammatic Fragmentary Cross-Sectional Side View

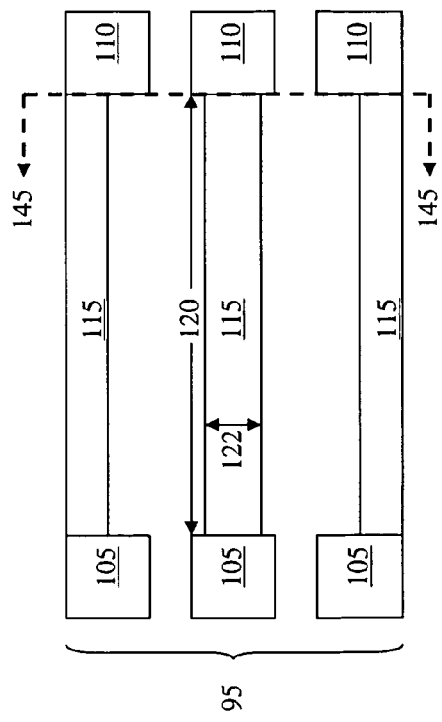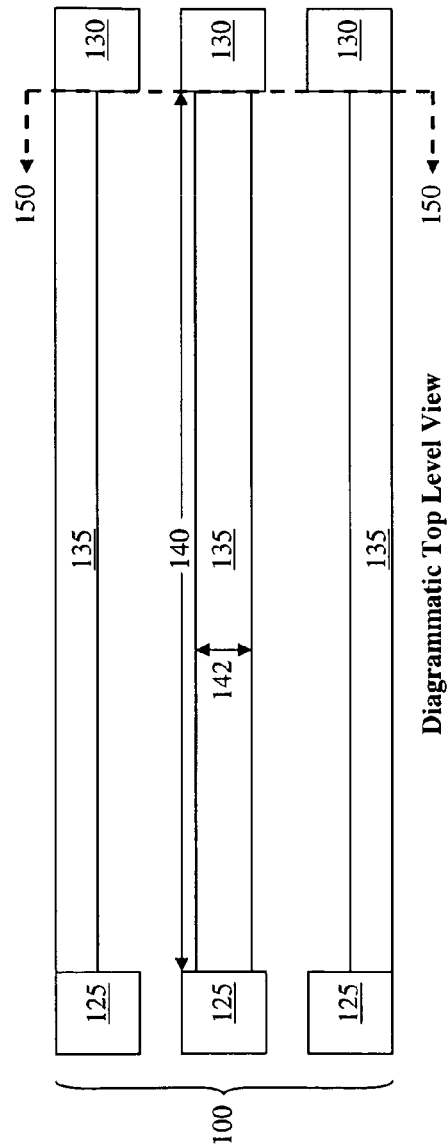

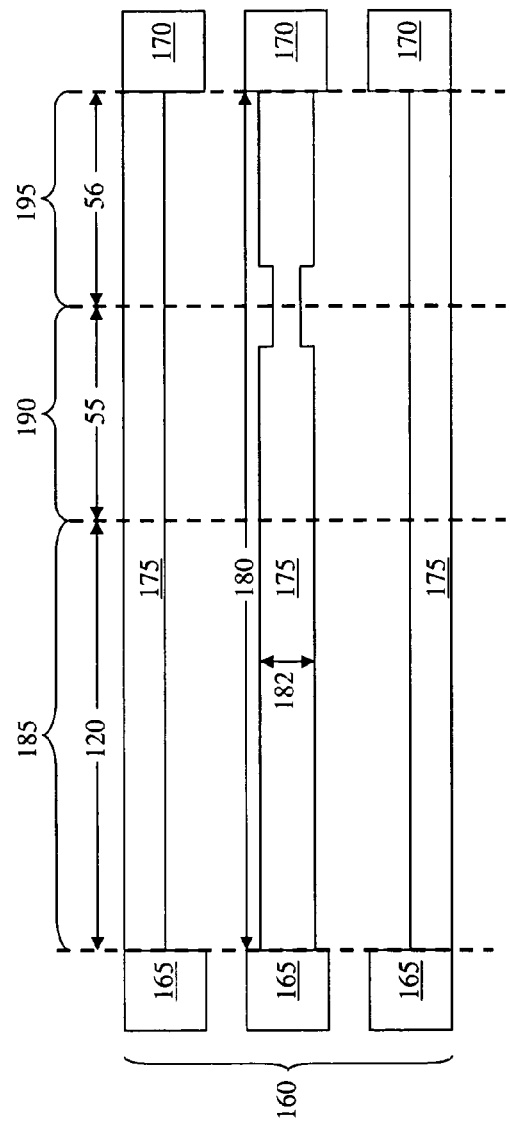
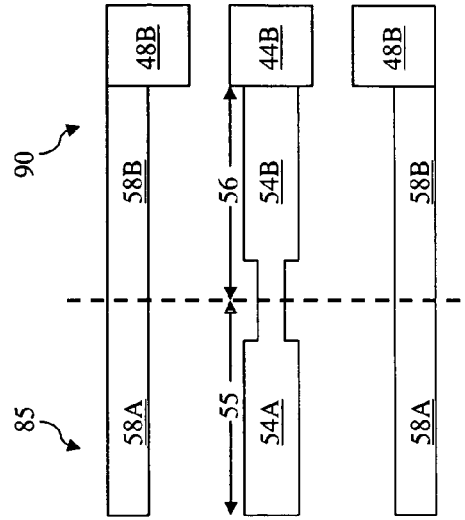
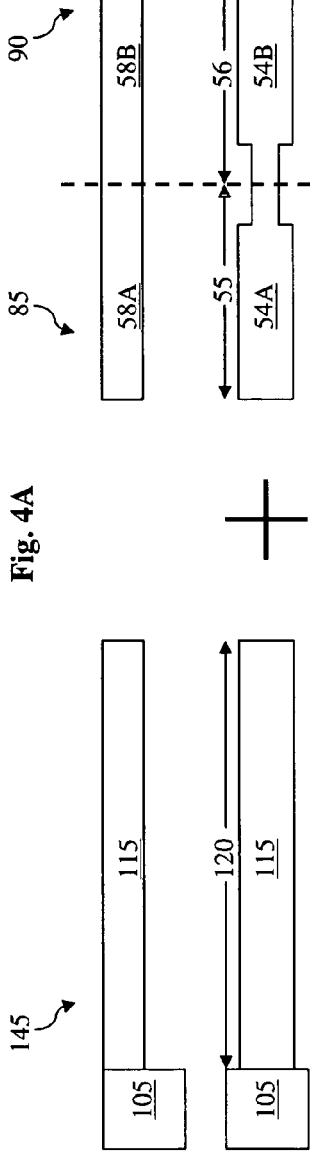
Fig. 4A
Fig. 4B

Diagrammatic 3-D View

Diagrammatic 3-D View

METHOD AND APPARATUS OF DEEMBEDDING

FIELD OF THE INVENTION

The present disclosure relates generally to testing of a semiconductor device, and more particularly, to a method and apparatus of de-embedding.

BACKGROUND

Integrated circuits (ICs) formed on semiconductor substrates include multiple active and passive components, such as resistors, inductors, capacitors, transistors, amplifiers, etc. Such components are fabricated to a design specification that defines the ideal physical/electrical characteristics the component will exhibit (e.g., resistance, inductance, capacitance, gain, etc.). Though it is desirable to verify that each component fabricated complies with its specific design specification, typically, after integration into a circuit, an individual component cannot be readily tested. Thus, "stand-alone" copies of the individual IC components, components fabricated with the same process and with the same physical/electrical characteristics as the IC components, are fabricated on the wafer; and it is assumed that the physical/electrical properties measured for the "stand-alone" copies represent those of the non-tested individual IC components.

During testing, the "stand-alone" copy, referred to as the "device-under-test" (DUT), is electrically connected to leads and test pads, which are further connected to external testing equipment. Though the physical/electrical properties measured should accurately represent those of the DUT (and the individual IC component represented), the test pads and leads contribute physical/electrical characteristics, known as "parasitics" (e.g., resistance, capacitance, and inductance from the test pads and leads), that contribute to the measured characteristics of the DUT. The parasitics are factored out or extracted by a process known as "de-embedding" to reveal the intrinsic characteristics of the DUT.

Thus, accurate de-embedding methods are required to eliminate the parasitic contributions and to accurately describe the intrinsic characteristics of the DUT (and ultimately, the individual IC component represented). Currently, on-wafer de-embedding methods referred to as "open-short," "open-thru," and "thru-reflect-line" ("TRL") have been widely used to account for parasitics such as resistance, inductance, and capacitance arising from the test pads and leads at high frequencies (up to the GHz level). However, the current de-embedding methods suffer from problems such as short over de-embedding, excessive parasitic contributions from via holes and interconnections, and lack of three-dimensional de-embedding capabilities. These problems become more severe at high frequencies, such as frequencies in the neighborhood of 50 giga-hertz (GHz). Thus, while existing methods of de-embedding have been generally adequate for their intended purposes, they have not been entirely satisfactory in every aspect.

SUMMARY

One of the broader forms of the present disclosure involves a method of de-embedding that includes, forming a test structure having a device-under-test embedded therein, the test structure having left and right pads coupling the device-under-test, the device-under-test dividing the test structure into left and right half structures, the left and right half structures each having intrinsic transmission parameters; forming a plurality of dummy test structures, each dummy test structure including a left pad and a right pad; measuring transmission parameters of the test structure and the dummy test structures; and deriving intrinsic transmission parameters of the device-under-test using the intrinsic transmission parameters of the left and right half structures and the transmission parameters of the test structure and the dummy test structures.

Another of the broader forms of the present disclosure involves an apparatus of de-embedding that includes a test structure having left and right pads; a device-under-test embedded in the test structure and dividing the test structure into a left half structure and a right half structure; and a plurality of dummy test structures each having left and right pads; wherein the dummy test structures have geometries correlating to geometries of the left and right half structures, such that intrinsic transmission characteristics of the device-under-test can be derived from transmission parameters of the dummy test structures and the test structure.

Still another of the broader forms of the present disclosure involves a method of de-embedding that includes forming a first test structure on a semiconductor wafer, the first test structure being symmetrical and having left and right pads; embedding a device-under-test in the first test structure, the device-under-test dividing the first test structure into a left half structure and a right half structure, the left and right half structures including first and second transmission lines, respectively, that each couple to the device-under-test; forming a second test structure on the semiconductor wafer, the second test structure having left and right pads coupled together by a third transmission line; measuring parasitic contributions of the first and second test structure as first and second parasitic contributions, respectively; calculating parasitic contributions of the left and right half structures using the first and second parasitic contributions; and extracting intrinsic transmission characteristics of the device-under-test using the first and parasitic contribution and the parasitic contributions of the left and right half structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a flowchart illustrating a method of de-embedding according to various aspects of the present disclosure;

FIGS. 2A, 3A-B, and 4A-B are Diagrammatic Top Level Views of various test structures used in the de-embedding method in accordance with FIG. 1;

DETAILED DESCRIPTION

Figure 2A:
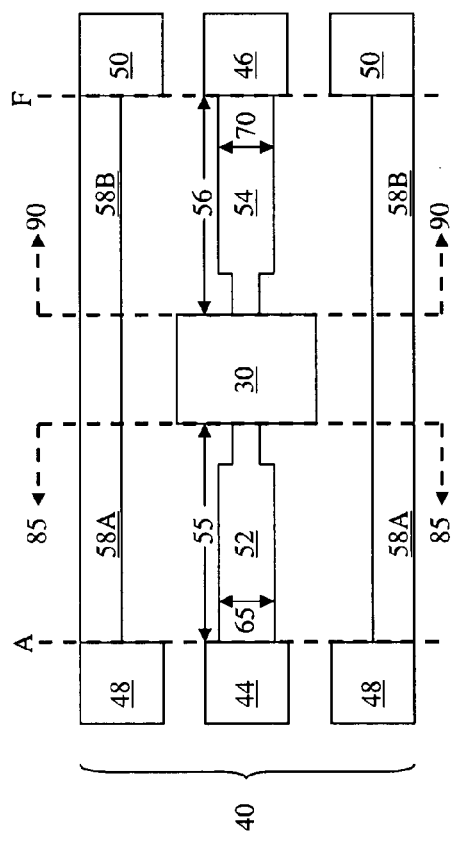

It is understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Illustrated in FIG. 1 is a flowchart of a method 11 of de-embedding according to various aspects of the present disclosure. Referring to FIG. 1, the method 11 begins with block 13 in which a test structure having a device-under-test embedded therein is formed. The test structure has left and right pads coupling the device-under-test. The device-under-test divides the test structure into left and right half structures. The left and right half structures each have intrinsic transmission parameters. The method 11 continues with block 15 in which a plurality of dummy test structures are formed. Each of the plurality of the dummy test structures includes a left pad and a right pad. The method 11 continues with block 17 in which transmission parameters of the test structure and the dummy test structures are measured. The method 11 continues with block 19 in which intrinsic transmission parameters of the device-under-test is derived using the intrinsic transmission parameters of the left and right half structures and the transmission parameters of the test structure and the dummy test structures.

FIGS. 2 to 4 illustrate Diagrammatic Top Level Views and/or Diagrammatic Fragmentary Cross Sectional Side Views of various test structures used in the de-embedding method in accordance with FIG. 1. Referring to FIG. 2A, a device-under test (DUT) 30 is embedded in a test structure 40. The DUT 30 includes an active or a passive radio frequency (RF) device in the present embodiment. For example, the DUT 30 may be a radio frequency integrated circuit (RFIC) device. The test structure 40 includes test pads 44, 46, 48 and 50. The test pads 44 and 46 include signal test pads, and the test pads 48 and 50 include ground test pads. In the present embodiment, the test pads 44 and 48 (as well as 46 and 50) are arranged in a ground-signal-ground (GSG) configuration, where the ground pads 48 are proximate to the signal pads 44. In alternate embodiments, the test structure 40 may be implemented with other configurations for the test pads 44 and 48, such as ground-signal (GS), ground-signal-ground-signal-ground (GSGSG), and/or any other suitable testing configurations. In one embodiment, the test structure 40 is designed and fabricated using a substrate-shielded technique known in the art, so that potential electromagnetic field radiation leakage to a semiconductor substrate (not illustrated) is reduced. In this substrate shielded technique, the test structure 40 is fabricated on the substrate and includes a bottom metal plane (not illustrated) that is grounded using denser via arrays to shield the silicon substrate. A feature of this implementation is that the test structure 40 may be regarded as an independent network without being coupled to other networks.

Referring back to FIG. 2A, the signal test pads 44 and 46 are electrically coupled to transmission lines 52 and 54 having lengths 55 and 56, respectively. The transmission lines 52 and 54 are also coupled to the DUT 30. Thus, electrical connections between the DUT 30 and external devices may be established. The ground test pads 48 and 50 are coupled to one another through conductive lines 58, which are transmission lines and may also be referred to as ground lines. The ground test pads 48 and ground lines 58 provide an electrical ground reference point for the DUT 30. The test pads 44 and 48, the transmission lines 52 and 54, and the ground lines 58 each include a conductive material such as aluminum, copper, aluminum-copper alloys, aluminum alloys, copper alloys, other metals, polysilicon, and/or combinations thereof. In the present embodiment, the signal test pads 44 and 46 and the ground test pads 48 and 50 have dimensions and materials that are approximately the same. It is understood that the test pads 44, 46, 48, and 50 may be coupled to an external device, such as a tester, so that electrical connections between the DUT 30 and the external device may be established. The transmission lines 52 and 54 also include widths 65 and 70, respectively. In the present embodiment, the widths 65 and 70 are both approximately equal to 0.4 microns (um), though the widths 65 and 70 may be greater than 0.4 um in other embodiments.

Figure 2B:
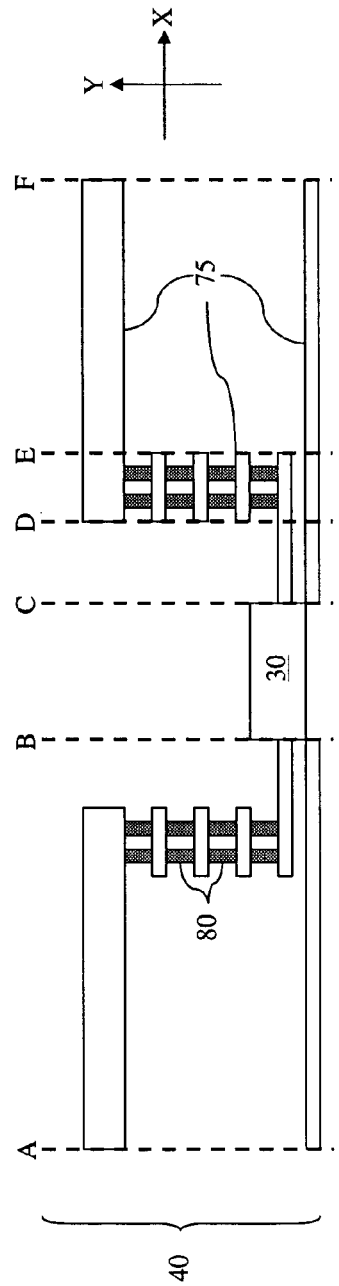
FIG. 2B is a Diagrammatic Fragmentary Cross-Sectional Side View of a test structure used in the de-embedding method in accordance with FIG. 1.

Referring now to FIG. 2B, a Diagrammatic Fragmentary Cross-Sectional Side View of the test structure 40 is illustrated. The test structure 40 includes a plurality of conductive layers 75 and vias 80 that are coupled to the DUT 30. The conductive layers 75 may also be known as inter-level metallization layers, which may exist in a plurality of semiconductor devices. The conducive layers 75 and the vias 80 include a conductive material such as metal, for example, aluminum, copper, aluminum-copper alloy, tungsten, or a combination thereof. The DUT 30 may be embedded in any one of the plurality of conductive layers 75 of the test structure 40. In the present embodiment, the conductive lines 75 and vias 80 together from point A to point B are represented by the transmission line 52 coupling the DUT 30 to the signal test pad 44 in FIG. 2A, and the conductive layers 75 and vias 80 together from point C to point F are represented by the transmission line 54 coupling the DUT 30 to the signal test pad 46 in FIG. 2A.

The DUT 30 has intrinsic transmission parameters that represent true physical/electrical characteristics of the DUT 30. When the DUT 30 is tested to measure these intrinsic transmission parameters, the components that couple to the DUT 30—such as the signal pads 44 and 46 and the transmission lines 52 and 54 shown in FIG. 2A—contribute parasitics, including parasitic resistance, parasitic capacitance, and parasitic inductance, to the measurement results, thus adversely affecting the accuracy of the measurements of the DUT 30. As such, various "de-embedding" methods have been utilized to extract the intrinsic transmission parameters of the DUT 30 from the measurement results of the DUT 30. However, as testing frequencies increase, the parasitic contributions of the components coupling to the DUT 30 become larger, which may render current de-embedding methods inaccurate. For example, referring to FIG. 2B, an electrical signal path from point C to point E may constitute as much as 40% of an electrical signal path from point C to point F of half of the test structure 40. It is very difficult for current de-embedding methods to account for the parasitic contributions arising from the electrical signal path from point C to point E of the test structure 40. In another example, a popular current de-embedding method utilizes an "open-short-through" approach, where in one aspect of the de-embedding, the DUT 30 is removed from the test structure 40, and an extra electrical short connection (not illustrated) is placed between point B and point C of the test structure 40. Since this electrical short connection may include metal and as such may contain resistance and inductance, it should not be de-embedded. However, the "open-short-through" de-embedding method does not take this into account and effectively de-embeds the electrical short connection from the measurement results anyhow. Consequently, the intrinsic transmission parameters of the DUT 30 obtained using the "open-short-through" deembedding method are not accurate. This phenomenon is referred to as "short over de-embedding," which means the resistance and inductance values that are removed during de-embedding are higher than the correct values that should have been removed. The "short over de-embedding" problem becomes especially pronounced at higher frequencies, for example at frequencies equal to or greater than 50 GHz. The "short over de-embedding" problem also gets worse as the electrical short connection becomes longer.

To overcome the limitations of the current de-embedding methods, the present embodiment utilizes multiple test structures to obtain accurate results for the intrinsic transmission parameters of the DUT 30. One of these multiple test structures is the test structure 40. Referring back to FIG. 2A, the DUT 30 divides the test structure 40 into a left half structure 85 and a right half structure 90. The left half structure 85 has parasitic contributions that may be expressed in terms of intrinsic transmission parameters, which may be represented by an ABCD matrix (also referred to as a transmission matrix) [Left_half], and the right half structure 90 has parasitic contributions that may be expressed in terms of intrinsic transmission parameters, which may be represented by an ABCD matrix [Right_half]. In general, an ABCD matrix can be obtained for a two port network such as the two port network shown below.

The ABCD matrix is defined in terms of the total voltages and currents such that:

$$V_1 = A*V_2 + B*I_2$$

$$I_1 = C*V_2 + D*I_2$$

$V_1$ and $V_2$ are input and output voltages of the two port network, respectively, and $I_1$ and $I_2$ are input and output currents of the two port network, respectively. Thus, A, B, C, D are elements of an ABCD matrix of the two port network, where A, B, C, D characterize relationships between input voltage $V_1$, output voltage $V_2$, input current $I_1$, and output current $I_2$. Putting the above equations in a matrix form, an ABCD matrix is obtained as:

$$\begin{bmatrix} V_1 \\ I_1 \end{bmatrix} = \begin{bmatrix} A & B \\ C & D \end{bmatrix} \begin{bmatrix} V_2 \\ I_2 \end{bmatrix}$$

The ABCD matrix may also be referred to as a transmission matrix, or transmission parameters of a two port network. A feature of the ABCD matrix is that, to calculate an ABCD matrix of two or more cascaded two port networks, the individual ABCD matrices of each network are multiplied. Similarly, to remove the ABCD matrix contributions of a two port network that is cascaded with other networks, the inverse matrix of that network is multiplied. Another feature of the ABCD matrix is that it can be obtained by measuring scattering parameters (S-parameters) of a two port network and then mathematically converting the S-parameter measurement results into an ABCD matrix. (For a more detailed discussion of ABCD matrices, refer to "Microwave Engineering, second edition" by David M. Pozar, pages 206-208). In the present embodiment, the length 55 of the transmission line 52 is approximately equal to the length 56 of the transmission line 54. Also recall that the test pads 44, 46, 48, and 50 all have approximately the same dimensions and include approximately the same materials. Thus, it may be said that the left half structure 85 is approximately symmetrical with the right half structure 90 in the present embodiment. Alternatively stated, the test structure 40 is a symmetrical test structure.

Since the signal test pad 44 and the ground test pads 48 are located to the "left" of the DUT 30 in FIG. 2, they may be referred to as left signal test pad 44 and left ground test pads 48, respectively. Similarly, the signal test pad 46 and the ground test pads 50 may be referred to as right signal test pad 46 and right ground test pads 50, respectively. The intrinsic transmission parameters (which represent the parasitic contributions) of the left signal test pad 44 and the left ground test pads 48 may be represented by an ABCD matrix [P_left], and the intrinsic transmission parameters of the right signal test pad 46 and right ground test pads 50 may be represented by an ABCD matrix [P_right]. It is understood that [P_left] and [P_right] take into account of potential discontinuity between a pad and an interconnect. In the present embodiment, since all the test pads 44, 46, 48, and 50 have approximately the same dimensions and include approximately the same materials, [P_left] is approximately equal to [P_right], and [P_left] and [P_right] may be collectively referred to as [Pad]. It is understood that in alternative embodiments, [P_left] may not be approximately equal to [P_right].

The test pads 44, 46, 48, and 50 may be coupled to a tester, so that transmission parameters of the entire test structure 40 may be obtained from measurement results. For example, using an instrument such as a network analyzer, the characteristics of the test structure 40 may be measured in terms of S-parameters. These S-parameter measurement results may then be converted to an ABCD matrix form, which is represented by [A']. For the ease of reference, intrinsic transmission parameters of the DUT 30 are referred to as [A]. It is understood that the intrinsic transmission parameters [A] of the DUT 30 may be obtained by taking the measured transmission parameters [A'] of the test structure 40, and removing (or extracting out) the intrinsic transmission parameters (or parasitic effects) of the left half structure 85 and the right half structure 90 from the measured transmission parameters [A']. Mathematically, this can be expressed as:

$$[A] = [Left\_half]^{-1} * [A'] * [Right\_half]^{-1} \quad \text{(equation 1)}$$

$[Left\_half]^{-1}$ and $[Right\_half]^{-1}$ are inverse matrices of [Left_half] and [Right_half], respectively. Since [A'] can be readily obtained from the measurement results of the test structure 40, only [Left_half] and [Right_half] need to be solved to calculate [A] and thus de-embed the DUT 30 out of the test structure 40 accurately. In FIG. 2A, it can also be seen that the left half structure 85 includes the left test pads 44, 48, and the transmission lines 52, 58A, and the right half structure 90 includes the right test pads 46, 50, and the transmission lines 54, 58B. Thus, the transmission parameters of the left half structure 85 can be obtained by cascading the transmission parameters of the pads 44, 48 and the transmission parameters of the transmission lines 52, 58A, and the transmission parameters of the right half structure 90 can be obtained by cascading the transmission parameters of the pads 46, 50 and the transmission parameters of the transmission lines 54, 58B. The transmission parameters of the transmission lines 52 and 58A in ABCD matrix form is

[Thru_left], and the transmission parameters of the transmission lines 54 and 58B in ABCD matrix form is [Thru_right]. Thus, the following equations are obtained:

$$[\text{Left\_half}] = [P\_\text{left}] * [\text{Thru\_left}] \quad \text{(equation 2)}$$

$$[\text{Right\_half}] = [P\_\text{right}] * [\text{Thru\_right}] \quad \text{(equation 3)}$$

Thus, equation 1 can also be rewritten as $[A]=[P\_\text{left}]^{-1}*[\text{Thru\_left}]^{-1}*[A']*[\text{Thru\_right}]^{-1}*[P\_\text{right}]^{-1}$.

Referring now to FIGS. 3A and 3B, a dummy test structure 95 and a dummy test structure 100 are illustrated. In one embodiment, the dummy test structure 95 illustrated in FIG. 3A is designed and fabricated using the substrate-shielded technique described above. The dummy rest structure 95 includes left test pads 105 and right test pads 110 arranged in a GSG configuration and coupled together by transmission lines 115 having a length 120 and a width 122. In an embodiment, the length 120 is greater than about 300 um, for example 500 um, and the width 122 is about 0.4 um, though the width 122 may be greater than 0.4 um in alternative embodiments. Parasitic contributions of the transmission lines 115 may be expressed in terms of intrinsic transmission parameters and may be represented by an ABCD matrix [M__1]. In the present embodiment, the left test pads 105 and the right test pads 110 have dimensions and include materials that are approximately the same as the dimensions and materials of the test pads 44, 46, 48, and 50 of the test structure 40 shown in FIG. 2A, respectively. Thus, the left test pads 105 and right test pads 110 have transmission parameters (or parasitic contributions) that are approximately equal to [P_left] and [P_right], respectively (which are approximately equal to each other in the present embodiment).

In one embodiment, the dummy test structure 100 illustrated in FIG. 3B is designed and fabricated using a substrate-shielded technique described above. The dummy test structure 100 includes left test pads 125 and right test pads 130, which are arranged in a GSG configuration and coupled together by transmission lines 135 having a length 140 and a width 142. In an embodiment where the length 120 of the transmission lines 115 is about 500 um, the length 140 of the transmissions 135 is about 1000 um Parasitic contributions of the transmission line 135 may be expressed in terms of intrinsic transmission parameters and may be represented by an ABCD matrix [M__21]. In the present embodiment, the left test pads 125 and the right test pads 130 have dimensions and include materials that are approximately the same as the dimensions and materials of the test pads 44, 46, 48, and 50 of the test structure 40 shown in FIG. 2A, respectively. Thus, the left test pads 125 and right test pads 130 have transmission parameters (or parasitic contributions) that are approximately equal to [P_left] and [P_right], respectively. The length 140 of the transmission line 135 is approximately equal to N times the length 120 of the transmission line 115. In the present embodiment, N=2, meaning that the length 140 of the transmission line 135 is about twice the length 120 of the transmission line 115. It is also known that ABCD matrices may be cascaded. Hence, the transmission parameters [M__21] of the transmission line 135 are approximately equal to [M__1]*[M__1].

The test pads 105 and 110 of the dummy test structure 95 may each be coupled to external testing equipment so that the transmission parameters of the dummy test structure 95 may be measured. The measurement of the transmission parameters may be done using S-parameters, and the measurement results may then be converted into an ABCD matrix format, so that the measured transmission parameters (in an ABCD matrix form) of the dummy test structure 95 may be obtained, which is expressed as [TL__11]. Similarly, the measured transmission parameters in an ABCD matrix form of the dummy test structure 100 may be obtained and may be expressed as [TL__12]. The following equations are then obtained:

$$[TL\_11] = [P\_\text{left}] * [M\_1] * [P\_\text{right}] \quad \text{(equation 4)}$$

$$[TL\_12] = [P\_\text{left}] * [M\_21] * [P\_\text{right}] \quad \text{(equation 5)}$$
$$= [P\_\text{left}] * [M\_1] * [M\_1] * [P\_\text{right}]$$

Through mathematical manipulations of the above equations, [P_left] or [P_right] and [M__1] may be solved and expressed by the following equations:

$$[P\_\text{left}]*[P\_\text{right}] = [TL\_11]*[TL\_12]^{-1}*[TL\_11] \quad \text{(equation 6)}$$

$$[M\_1] = [P\_\text{left}]^{-1}*[TL\_11]*[P\_\text{right}]^{-1} \quad \text{(equation 7)}$$

Since [TL__11] and [TL__12] are obtained from measurement results, [P_left], [P_right] and [M__1] can be accurately calculated. In one embodiment, the following results for [P_left] and [P_right] are calculated:

$$[P\_\text{left}] = \begin{bmatrix} 1 & B/2 \\ C/(1+(A+D)/2) & 1+BC/2(1+(A+D)/2) \end{bmatrix} \quad \text{(equation 8)}$$

$$[P\_\text{right}] = \begin{bmatrix} 1+BC/2(1+(A+D)/2) & B/2 \\ C/(1+(A+D)/2) & 1 \end{bmatrix} \quad \text{(equation 9)}$$

where A, B, C, and D represent the elements of the ABCD matrix for the test structure 40. The ABCD parameters may be obtained by measuring the S-parameters of the test structure 40 and then mathematically converting these S-parameters into ABCD parameters.

As described previously, [P_left] represents the intrinsic transmission parameters (or parasitic contributions) of one of the left test pads 105, 125, 44, and 48. [P_right] represents the intrinsic transmission parameters (or parasitic contributions) of one of the right test pads 110, 130, 46 and 50, respectively. [M__1] represents the intrinsic transmission parameters (or parasitic contributions) of a transmission line having a length approximately equal to length 120 of the transmission line 115. Using equations 8 and 9, [Thru_left] and [Thru_right] can also be calculated. Thereafter, using equations 2 and 3, [Left_half] and [Right_half] can be calculated. In one embodiment, the lengths 55 and 56 of the transmission lines 52 and 54, respectively, are approximately equal to the length 120 of the transmission line 115. Thus, [Thru_left] and [Thru_ right] are approximately equal to [M__1]. Since [M__1] can be calculated using equations 4-9, [Thru_left] and [Thru_ right] may also be obtained.

Further, the intrinsic transmission parameters of the left test pads 105 cascaded with the transmission line 115 may be expressed in ABCD matrix form as [TL_left1]. [TL_left1] can also be obtained by multiplying the measured transmission parameters [TL__11] by [P_right]$^{-1}$, since [TL_left1] represents intrinsic transmission parameters of a structure 145 that is essentially the same as the dummy test structure 95 without its right test pads 110. For the sake of illustration, the structure representing [TL_left1] is denoted by the arrows and dashed lines drawn over the dummy test structure 95. Similarly, intrinsic transmission parameters of the left test pads 125 cascaded with the transmission line 135 represents intrinsic transmission parameters [TL_left2] of a structure 150 that is essentially the same as the dummy test structure 100 without its right test pads 130. For the sake of illustration, the structure representing [TL_left2] is denoted by the arrows and dashed line drawn over the dummy test structure 100. [TL_left2] may also be obtained by multiplying the measured transmission parameters [TL_12] by [P_right]$^{-1}$, where [P_right]$^{-1}$ represents an inverse matrix of [P_right].

Referring now to FIG. 4A, a dummy test structure 160 is illustrated. In one embodiment, the dummy test structure 160 is designed and fabricated using a substrate-shielded technique described above. The dummy test structure 160 includes left test pads 165 and right test pads 170 arranged in a GSG configuration and coupled by transmission lines 175 having a length 180 and a width 182. In an embodiment, the width 182 is about 0.4 um, though the width 182 may be greater than 0.4 um in alternative embodiments. The test pads 165 and 170 may be coupled to an external tester to obtain measurement results of the transmission parameters of the entire dummy test structure 160. For example, S-parameters may be measured, which may then be converted to an ABCD matrix [THRU], where [THRU] represents the measured transmission parameters (or parasitic contribution) of the entire dummy test structure 160. The transmission line 175 may be conceptually decomposed into three segments—segment 185, segment 190, and segment 195. In the present embodiment, the segment 185 has a length that is approximately equal to the length 120 of the transmission line 115 of the dummy test structure 95 in FIG. 3A. In an alternative embodiment, the segment 185 has a length that is approximately equal to the length 140 of the transmission line 135 of the dummy test structure 100 in FIG. 3B.

Referring back to FIG. 4A, the segment 190 has a length that is approximately equal to the length 55 of the transmission line 52 of the test structure 40 in FIG. 2A, and the segment 195 has a length that is approximately equal to the length 56 of the transmission line 54 of the test structure 40. Thus, the length 180 of the transmission line 175 is approximately equal to a sum of the length 120, the length 55, and the length 56. In addition, the dummy test structure 160 may be conceptually decomposed into the following structures illustrated in FIG. 4B: the structure 145 (which is the dummy test structure 95 without the right pads 110) in FIG. 3A, the left half structure 85 in FIG. 2A without its left pads 44 and 48, and the right half structure 90 in FIG. 2A. Mathematically, this decomposition may be expressed as the following:

[THRU]=[TL_left1]*[Left_half]*[P_left]$^{-1}$*[Right_half].     (equation 10)

Recall that [THRU] can be readily obtained from the measurement results of the dummy test structure 160, and [P_left] can be calculated using the dummy test structures 95 and 100 and conducting mathematical manipulations, and that [TL_left1] can also be calculated either as [TL_11]*[P_right]$^{-1}$ or [P_left]*[M_1]. Thus, [Left_half] and [Right_half] may be solved.

Once [Left_half] and [Right_half] are obtained, using equation 1 where [A]=[Left_half]$^{-1}$*[A']*[Right_half]$^{-1}$, [A] (the intrinsic transmission parameters of the DUT 30) can be solved. The solved intrinsic transmission parameters of the DUT 30 represent the true transmission characteristics of the DUT 30, free from the parasitic contributions of pads and transmission lines coupling the DUT 30 to external devices.

Using the test structures 40, 95, 100, and 160, the following sequences of actions summarize one embodiment of de-embedding:

1) Measure the scattering matrices of the transmission line 115 having the length 120, the transmission line 135 having the length 140, the test structure 160, and the test structure 40.
2) Convert the scattering matrices of the transmission lines 115 and 135 and the test structures 160 and 40 to their ABCD matrices [M_1], [M_21], [THRU], and [A], respectively.
3) Calculate the ABCD matrices of the left-side test pads 44, 48 and the right-side test pads 46, 50, to obtain [P_left] and [P_right], respectively.
4) Calculate the ABCD matrices of the transmission lines 52 and 54 to obtain [Thru_left] and [Thru_right], respectively.
5) Calculate the ABCD matrix [A] to obtain the intrinsic transmission parameters of the DUT 30.

In the present embodiment, the test structures 40, 95, 100 and 160 are formed on the same semiconductor wafer. The test structures 40, 95, 100, and 160 are also fabricated using the same technologies and processes (for example, a 65 nm RF-CMOS technology) in the present embodiment. It is also understood that the DUT 30 may be formed along with the forming of the test structure 40. In alternative embodiments, the test structures 40, 95, 100, and 160 may be fabricated using different processes and be formed on different wafers.

It is also understood that the test structures 40, 95, 100, and 160 may each have a three-dimensional structure. In some embodiments, the parasitic components such as transmission lines and/or pads that need to be de-embedded may not be located on the same two-dimensional layer level. For example, as is illustrated in FIG. 2B, the transmission from point D to point F extends along an X-axis, whereas the vias and metal layers from point C to point D extends not only along the X-axis but also a Y-axis. Since the transmission line from point D to point F also has a width (not observable in FIG. 2B but can be observed in FIG. 2A), the transmission line from point D to point F is already a two-dimensional feature. Since the transmission line from point C to point F (transmission line 54) includes an extra dimension (the Y-axis), the transmission line 54 is a three-dimensional feature. Traditional methods of de-embedding have had difficulties in de-embedding three-dimensional features such as the transmission line 54 shown in FIG. 2B, but such difficulties can be overcome using the methods and structures described above.

In some embodiments, coplanar waveguides (CPW) are used as the various transmission lines of test structures 40, 95, 100, and 160. As described previously, a semiconductor device may include a plurality of inter-level metallization layers. These CPW features may be placed on any of the inter-level metallization layers. Measurements (such as S-parameter measurements) may be made directly on the CPW features to prevent layout mismatch between the measured parasitics of the dedicated de-embedding dummy structures (such as test structures 95, 100, and 160) and the test structure having the DUT embedded therein (such as the test structure 40). This technique allows more accurate transmission line modeling. As an example, Table I. below lists several different types of transmission lines that may be used.

TABLE I

| Name | Transmission Line Type | Metal Shield Layer | Strip Length | Strip Space | Shield Type |
|---|---|---|---|---|---|
| CPW | CPW | | No strip shields | | |
| FSCPW1 | Floating slow-wave CPW | M9, M7 | 0.1 um | 0.1 um | Floating |
| FSCPW2 | Floating slow-wave CPW | M9, M7 | 0.1 um | 0.9 um | Floating |
| FSCPW3 | Floating slow-wave CPW | M9, M2 | 0.1 um | 0.1 um | Floating |
| GSCPW1 | Grounded slow-wave CPW | M9, M7 | 0.1 um | 0.1 um | Grounded |
| GSCPW2 | Grounded slow-wave CPW | M9, M7 | 0.1 um | 0.9 um | Grounded |
| GSCPW3 | Grounded slow-wave CPW | M9, M2 | 0.1 um | 0.1 um | Grounded |

Figure 5B:
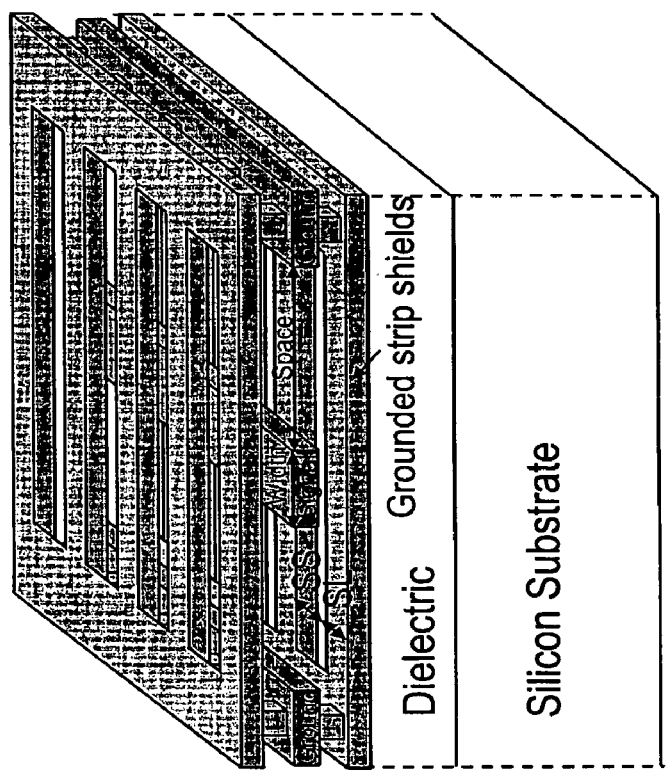
FIGS. 5A-B are Diagrammatic Three-Dimensional (3-D) Views of a slow-wave CPW transmission line with slot-type floating shields and a slow-wave CPW transmission line with slot-type grounded shields, respectively, according to various aspects of the present disclosure.
Figure 5A:
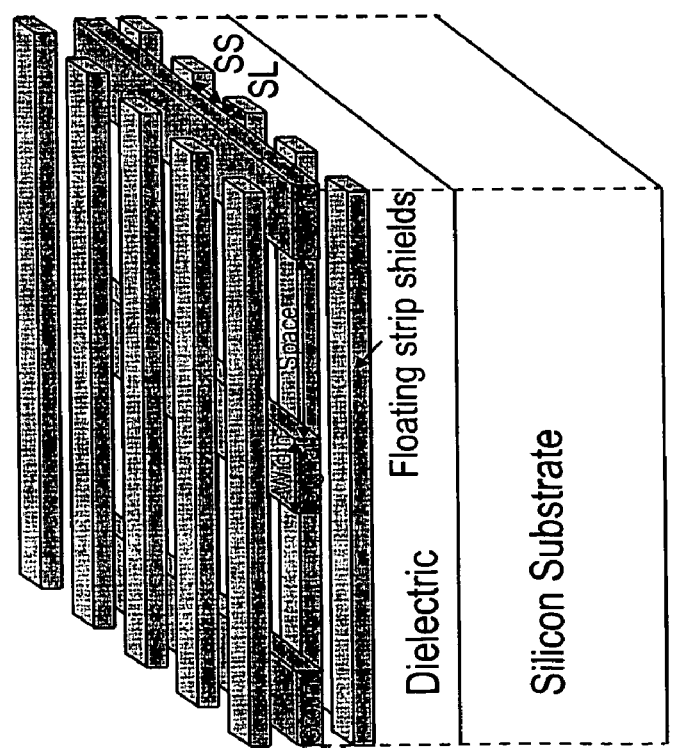

CPW in table I is a coplanar waveguide transmission line without shields, FSCPW1-FSCPW3 are transmission lines with slot-type floating shields, and GSCPW1-GSCPW3 are transmission lines with slot-type grounded shields. Referring to FIGS. 5A and 5B, diagrammatic three-dimensional views of a slow-wave CPW transmission line with slot-type floating shields and a slow-wave CPW transmission line with slot-type grounded shields are illustrated, respectively. In FIG. 5A, a slow-wave CPW transmission line with slot-type floating shields may be designed with periodically slot-type floating shields located both above and below the CPW structure and the slot-type floating shields are oriented transversely to the CPW structure. In one embodiment, for all transmission lines in Table I, the CPW structure is formed on an eighth (M8) metal layer and the slot-type shields are created on either a seventh (M7) or a second (M2) metal layer. The CPW part of the structure has a signal/ground line width of 10 um/10 um, with a 20 um space between signal and ground lines. The upper strip shields with a fixed strip length (SL) of 2 um and a fixed strip space (SS) of 2 um, and the lower strip shields have a variable SL and a variable SS. The SL may be designed to be the minimum length to achieve a high performance with minimized eddy-current loss. The minimum length on M7 and M2 is 0.1 um for a 65 nm CMOS technology. The lower slot-type floating shields are designed with the following dimension splits, (1) the SL on M7 is 0.1 um and the accompanying SS is either 0.1 um or 0.9 um, and (2) the SL on M2 is 0.1 um and the accompanying SS is 0.1 um. In FIG. 5B, for the grounded slow-wave CPW transmission line, it is designed with the similar structure as that of the slow-wave CPW transmission line with floating shields as described above, but with the slot-type shields connected to the ground. In one embodiment, all of the test structures described above have the same length of 500 um and width of 80 um.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of de-embedding, comprising:
    forming a test structure having a device-under-test embedded therein, the test structure having left and right pads coupling the device-under-test, the device-under-test dividing the test structure into left and right half structures, the left and right half structures each having intrinsic transmission parameters;
    forming a plurality of dummy test structures, each dummy test structure including a left pad and a right pad;
    measuring transmission parameters of the test structure and the dummy test structures; and
    deriving intrinsic transmission parameters of the device-under-test using the intrinsic transmission parameters of the left and right half structures and the transmission parameters of the test structure and the dummy test structures.

2. The method of claim 1, wherein the forming of the test structures is carried out so that the device-under-test is coupled to the left pad by a first transmission line having a first length, and the device-under-test is coupled to the right pad by a second transmission line having a second length, and wherein the forming of the plurality of dummy test structures is carried out so that first, second, and third dummy test structures are formed, wherein:
    in the first dummy test structure, the left and right pads are coupled by a third transmission line having a third length;
    in the second dummy test structure, the left and right pads are coupled by a fourth transmission line having a fourth length that is about N times the third length; and
    in the third dummy test structure, the left and right pads are coupled by a fifth transmission line having a fifth length that is approximately equal to one of (a sum of the first length, the second length, and the third length) and (a sum of the first length, the second length, and the fourth length).

3. The method of claim 2, wherein the forming of the test structure and the forming of the first, second, and third dummy test structures are carried out so that:
    N=2;
    the first length is approximately equal to the second length; and
    the fifth length is approximately equal to the sum of the first length, the second length, and the third length.

4. The method of claim 2, wherein the forming of the test structure and the forming of the first, second, and third dummy test structures are carried out so that the fifth transmission line includes a first segment, a second segment, and a third segment, wherein:
    a length of the first segment is approximately equal to one of the third length and the fourth length;
    a length of the second segment is approximately equal to the first length; and
    a length of the third segment is approximately equal to the second length.

5. The method of claim 1, wherein the deriving of the intrinsic transmission parameters includes calculating the intrinsic transmission parameters of the device-under-test using an equation $[A]=[Left\_half]^{-1}*[A']*[Right\_half]^{-1}$, wherein $[A]$, $[Left\_half]$, $[A']$, and $[Right\_half]$ are each represented in an ABCD matrix form, and wherein:

[A] represents the intrinsic transmission parameters of the device-under-test;

[A'] represents the transmission parameters of the test structure;

[Left_half] represents the intrinsic transmission parameters of the left half structure; and

[Right_half] represents the intrinsic transmission parameters of the right half structure.

6. The method of claim 5, wherein the deriving of the intrinsic transmission parameters further includes calculating [Left_half] and [Right_half] using an equation [THRU]= [TL_left1]*[Left_half]*[P_left]$^{-1}$*[Right_half], wherein [THRU], [P_left] and [TL_left] are each represented in an ABCD matrix form, and wherein:

[THRU] represents the transmission parameters of the third dummy test structure;

[P_left] represents intrinsic transmission parameters of one of the left pad of the test structure and the left pad of one of the dummy test structures; and

[TL_left1] represents (one of the transmission parameters of the first dummy test structure and the transmission parameters of the second dummy test structure) multiplied by [P_right]$^{-1}$, [P_right]$^{-1}$ representing an inverse matrix of intrinsic transmission parameters of one of the right pad of the test structure and the right pads of the dummy test structures.

7. The method of claim 6, wherein the calculating of [Left_half] and [Right_half] further includes calculating [P_left] and [P_right], wherein [P_left] and [P_right] are calculated to be:

$$[P\_left] = \begin{bmatrix} 1 & B/2 \\ C/(1+(A+D)/2) & 1+BC/2(1+(A+D)/2) \end{bmatrix}$$

$$[P\_right] = \begin{bmatrix} 1+BC/2(1+(A+D)/2) & B/2 \\ C/(1+(A+D)/2) & 1 \end{bmatrix}$$

and wherein A, B, C, D are elements of an ABCD matrix of the test structure, and wherein A, B, C, D characterize relationships between an input current, an output current, an input voltage, and an output voltage of the test structure, and wherein A, B, C, D are obtained by measuring scattering parameters of the test structure and mathematically converting the scattering parameters into the ABCD matrix.

8. The method of claim 6, wherein the deriving of the intrinsic transmission parameters further includes deriving [P_left] and [P_right] using [TL_11] and [TL_12], wherein [TL_11] and [TL_12] represents the transmission parameters of the first and second dummy test structures in an ABCD matrix form, respectively.

9. The method of claim 8, wherein the deriving of the [P_left] and [P_right] includes solving equation [TL_11]= [P_left]*[M_1]*[P_right] together with equation [TL_11]= [P_left]*[M_1]*[M_1]*[P_right] to obtain equation [P_left]*[P_right]=[TL_11]*[TL_12]$^{-1}$*[TL_11], wherein [M_1] represents intrinsic transmission parameters in an ABCD matrix form of a transmission line coupling the left and right pads of the first dummy test structure.

10. An apparatus, comprising:
a test structure having left and right pads;
a device-under-test embedded in the test structure and dividing the test structure into a left half structure and a right half structure; and
a plurality of dummy test structures each having left and right pads;
wherein the dummy test structures have geometries correlating to geometries of the left and right half structures, such that intrinsic transmission characteristics of the device-under-test can be derived from transmission parameters of the dummy test structures and the test structure.

11. The apparatus of claim 10, wherein the plurality of dummy test structures includes first, second, and third dummy test structures, and wherein:
in the test structure, the device-under-test is coupled to the left pad by a first transmission line having a first length, and the device-under-test is coupled to the right pad by a second transmission line having a second length;
in the first dummy test structure, the left and right pads are coupled by a third transmission line having a third length;
in the second dummy test structure, the left and right pads are coupled by a fourth transmission line having a fourth length that is about N times the third length; and
in the third dummy test structure, the left and right pads are coupled by a fifth transmission line having a fifth length that is approximately equal to one of (a sum of the first length, the second length, and the third length) and (a sum of the first length, the second length, and the fourth length).

12. The apparatus of claim 11, wherein N=2, the first length is approximately equal to the second length, and the fifth length is approximately equal to the sum of the first length, the second length, and the third length.

13. The apparatus of claim 11, wherein the fifth transmission line includes a first segment, a second segment, and a third segment, wherein:
a length of the first segment is approximately equal to one of the third length and fourth length;
a length of the second segment is approximately equal to the first length; and
a length of the third segment is approximately equal to the second length.

14. The apparatus of claim 11, wherein dimensions and materials of the left and right pads are approximately the same, and wherein the test structure is approximately symmetrical, and wherein the test structure and the first, second, and third dummy test structures are all formed on a same semiconductor wafer.

15. The apparatus of claim 11, wherein the left and right pads are signal pads, and wherein the first, second, and third dummy test structures and the test structure each include ground pads proximate to the signal pads, wherein the ground pads and signal pads have a ground-signal-ground configuration, and wherein the device-under-test is embedded in a metal layer of the test structure.

16. A method of de-embedding, comprising:
forming a first test structure on a semiconductor wafer, the first test structure being symmetrical and having left and right pads;
embedding a device-under-test in the first test structure, the device-under-test dividing the first test structure into a left half structure and a right half structure, the left and right half structures including first and second transmission lines, respectively, that each couple to the device-under-test;
forming a second test structure on the semiconductor wafer, the second test structure having left and right pads coupled together by a third transmission line;

measuring parasitic contributions of the first and second test structure as first and second parasitic contributions, respectively;

calculating parasitic contributions of the left and right half structures using the first and second parasitic contributions; and extracting intrinsic transmission characteristics of the device-under-test using the first and parasitic contribution and the parasitic contributions of the left and right half structures.

17. The method of claim 16, further including:

forming a third test structure and a fourth test structure on the semiconductor wafer, the third test structure having left and right pads coupled by a fourth transmission line, the fourth test structure having left and right pads coupled by a fifth transmission line, the left and right pads of the third and fourth test structures having dimensions that are approximately equal to dimensions of the left and right pads of the first and second test structure;

measuring parasitic contributions of the third and fourth test structures as third and fourth parasitic contributions, respectively; and calculating a parasitic contribution of one the left and right pads of the test structures in a transmission matrix form.

18. The method of claim 17, wherein the extracting of the intrinsic transmission characteristics includes:

expressing the first, second, third, and fourth parasitic contributions in a transmission matrix form; and calculating the intrinsic transmission characteristics in a transmission matrix form by multiplying an inverse matrix of the parasitic contribution of the left half structure, the first parasitic contribution, and an inverse matrix of the parasitic contribution of the right half structure.

19. The method of claim 18, wherein the extracting of the intrinsic transmission characteristics further includes calculating the parasitic contributions of the left and right half structure by equating the fourth parasitic contribution with a product obtained from multiplying the following:

the second parasitic contribution multiplied by an inverse matrix of the parasitic contribution of one of the right pads;

the parasitic contribution of the left half structure;

an inverse matrix of the parasitic contribution of the one of the left pads; and the parasitic contribution of the right half structure.

20. The method of claim 17, wherein the forming of the first, second, third, and fourth test structures are carried out so that:

the first transmission line is approximately as long as the second transmission line;

the fourth transmission line is approximately twice as long as the third transmission line; and the fifth transmission line includes a first segment, a second segment, and a third segment, the first segment being approximately as long as the first transmission line, the second segment being approximately as long as the second transmission line, and the third segment being approximately as long as the third transmission line.

* * * * *